United States Patent
O'Riordan et al.

(10) Patent No.: US 8,875,077 B1
(45) Date of Patent: Oct. 28, 2014

(54) FAULT SENSITIVITY ANALYSIS-BASED CELL-AWARE AUTOMATED TEST PATTERN GENERATION FLOW

(71) Applicant: Cadence Design Systems, Inc., San Jose, CA (US)

(72) Inventors: Donald J. O'Riordan, Sunnyvale, CA (US); Bassilios Petrakis, San Jose, CA (US); Kevin Chou, Atherton, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/176,921

(22) Filed: Feb. 10, 2014

(51) Int. Cl.
G06F 9/455 (2006.01)
G06F 17/50 (2006.01)

(52) U.S. Cl.
CPC .................................. *G06F 17/5081* (2013.01)
USPC ........................................................... 716/112

(58) Field of Classification Search
USPC ........................................................... 716/112
See application file for complete search history.

(56) References Cited

U.S. PATENT DOCUMENTS

| | | | |
|---|---|---|---|
| 4,937,765 A | 6/1990 | Shupe et al. | |
| 5,084,824 A | 1/1992 | Lam et al. | |
| 5,157,668 A | 10/1992 | Buenzli, Jr. et al. | |
| 5,325,309 A | 6/1994 | Halaviati et al. | |
| 5,475,695 A | 12/1995 | Caywood et al. | |
| 6,009,251 A | 12/1999 | Ho et al. | |
| 6,035,114 A | 3/2000 | Tseng et al. | |
| 6,611,948 B1 | 8/2003 | Tyler et al. | |
| 7,103,434 B2 | 9/2006 | Chernyak et al. | |
| 7,117,471 B1 | 10/2006 | Li et al. | |
| 7,296,249 B2 | 11/2007 | Rinderknecht et al. | |
| 7,472,051 B2 | 12/2008 | Mariani et al. | |
| 7,562,321 B2 | 7/2009 | Wang et al. | |
| 7,716,611 B2 | 5/2010 | Pikus et al. | |
| 2004/0060017 A1 | 3/2004 | Abdennadher | |
| 2006/0041417 A1 | 2/2006 | Palladino | |
| 2008/0276206 A1 | 11/2008 | Mariani | |
| 2010/0229061 A1* | 9/2010 | Hapke et al. | 714/740 |
| 2010/0257494 A1 | 10/2010 | Pouarz et al. | |
| 2013/0054161 A1* | 2/2013 | Hapke et al. | 702/59 |
| 2014/0059507 A1* | 2/2014 | Sunter | 716/112 |

OTHER PUBLICATIONS

Mei, Kenyon C.Y., "Bridging and Stuck-At Faults," IEEE Transaction on Computers, vol. c-23, No. 7, Jul. 1974, pp. 720-727.

Ferguson, F. Joel, et al,, "Test Pattern Generation for Realistic Bridge Faults in CMOS ICs," IEEE International Test Conference, Oct. 1991, pp. 492-499.

Spinner, Stefan, et al., "Automatic Test Pattern Generation for Interconnect Open Defects," 26th IEEE VLSI Test Symposium, Apr. 2008, pp. 181-186.

(Continued)

*Primary Examiner* — Suresh Memula
(74) *Attorney, Agent, or Firm* — Kenyon & Kenyon LLP

(57) ABSTRACT

A system, method, and computer program product for cell-aware fault model generation. Embodiments determine defects of interest for a cell, typically from cell layout and a transistor-level cell netlist. A circuit simulator performs analog fault simulation on the transistor-level netlist to determine detectable defects from the defects of interest, and detection conditions for the detectable defects. The circuit simulator employs fault sensitivity analysis (FSA) for amenable cells for greatly accelerated fault detection. Embodiments generate and output cell-aware fault models for the detectable defects from the detection conditions, for use in automated test pattern generation.

20 Claims, 10 Drawing Sheets

(56) References Cited

OTHER PUBLICATIONS

Waicukauski, John A., et al., "Transition Fault Simulation," IEEE Design & Test Sets of Computers, Apr. 1987, pp. 32-38.

Pomeranz, Irith, et al., "On n-Detection Test Sets and Variable n-Detection Test Sets for Transition Faults," in Proc. of VTS, Apr. 1999, pp. 173-180.

Geuzebroek, Jeroen, et al., "Embedded Multi-Detect ATPG and Its Effect on the Detection of Unmodeled Defects," IEEE ITC, Oct. 2007, paper 30.3, pp. 1-10.

Cho, Kyoung Youn, et al., "Gate Exhaustive Testing," IEEE, ITC, paper 31.3, Nov. 2005, pp. 1-7.

Hapke, F., et al., "Defect-Oriented Cell-Aware ATPG and Fault Simulation for Industrial Cell Libraries and Designs," IEEE ITC, Nov. 2009, paper 1.2, pp. 1-10.

Hapke, F., et al., "Cell-Aware Production Test Results From a 32-nm Notebook Processor," IEEE ITC, Nov. 2012, paper 1.1, pp. 1-9.

Engelke Piet et al., "Resistive Bridging Fault Simulation of Industrial Circuits", Design, Automation and Test in Europe, Aug. 2008, p. 628-633.

Liao, Yuyun et al., "Fault Coverage Analysis for Physically-Based CMOS Bridging Faults at Different Power Supply Voltages", Proceedings 1996 IEEE International Test Conference, Test and Design Validity, Washington, D.C., USA, Oct. 20-25, 1996, p. 767-775.

Rodriguez-Montanes, R. et al., "Bridging Defects Resistance Measurements in a CMOS Process", Proceedings, IEEE International Test Conference 1992, Paper 41.3, 0-8186-3167, Aug. 1992, pp. 892-899.

Sar-Dessai, Vijay R., et al., "Resistive Bridge Fault Modeling, Simulation and Test Generation", Proceedings, 1999 IEEE ITC International Test Conference, Paper 23.2, 0-7803-5753, Jan. 1999, p. 596-605.

Kruseman, Bram, et al., "Defect Oriented Testing for Analog/Mixed-Signal Devices", 2011 IEEE International Test Conference, Paper 1.1, 978-1-4577-0152, Aug. 2011, p. 1-10.

\* cited by examiner

FAULT SENSITIVITY ANALYSIS-BASED CELL-AWARE AUTOMATED TEST PATTERN GENERATION FLOW

CROSS REFERENCE TO RELATED APPLICATIONS

The present application is related to commonly-assigned U.S. application Ser. No. 13/683,889, entitled "Analog Fault Visualization System And Method For Circuit Designs", filed on Nov. 21, 2012, which is hereby incorporated by reference in its entirety. The present application is also related to commonly-assigned U.S. application Ser. No. 13/843,139, entitled "Efficient Single-Run Method To Determine Analog Fault Coverage Versus Bridge Resistance", filed on Mar. 15, 2013, which is also hereby incorporated by reference in its entirety.

FIELD OF THE INVENTION

The present invention relates to the field of circuit simulation, and more precisely to using fault sensitivity analysis techniques for cell-aware fault model generation and cell-aware automated test pattern generation (ATPG).

BACKGROUND

As integrated circuit complexity increases, meeting the testing requirements for acceptable quality assurance is becoming increasingly difficult. Automated testing involves applying test signals to each manufactured circuit in various patterns designed to detect defects that cause improper circuit behavior. Although most modern integrated circuits comprise a number of interconnected cells selected from a library, early testing schemes assumed that faults occurred only between cell instances, at the cell I/O ports, or elsewhere outside cells altogether. The test patterns generated therefore did not necessarily include those needed to detect circuit faults inside a cell.

A more recently developed methodology for ATPG is termed "cell-aware". This approach directly targets defects inside a given library cell, typically those defects that have been extracted from the actual circuit design layout. Such defects may be physically correlated to actual observed fabrication errors, and are therefore of particular interest. Bridge defects causing an unintended short or low-resistance connection, and open defects causing an unintended disconnection, for example are typically of highest interest. Defect prediction tools are commercially available to estimate defect probabilities for given circuit structures, such as long narrow closely-spaced parallel metal runs, etc. Some integrated circuit manufacturers may provide additional information of use in estimating the occurrence of defects.

FIG. 1 shows an exemplary conventional cell-aware ATPG flow that has been implemented with commercially available design tools. The flow starts with layout extraction 104, which produces a transistor netlist 106 and a list of possible faults or defects of interest 108, from the cell layout 102. Next, for each extracted defect, a transistor-level analog (e.g., SPICE) simulation 110 determines the complete set of cell input combinations that detect the defect by recognizing the resulting incorrect circuit behavior.

A cell-aware synthesis 114 process optimizes a defect detection matrix 112 resulting from fault model evaluation, to generate the corresponding library view 116 and simplify the subsequent ATPG. The library view contains one or more alternative conditions for detecting the corresponding defect for each cell-internal defect in the fault list. The final ATPG step 118 generates test patterns from the library view 116 that provide a higher percentage of defect detection or "test coverage" 120 compared to test patterns generated via other fault models. Cell-aware ATPG flows have achieved compelling results and are thus becoming increasingly popular.

However, the cell-aware fault model creation process relies on exhaustive analog simulation 110 to determine if a particular defect is detectable, from the severity of improper circuit behavior it causes. Each cell is first simulated without defects to determine the proper cell output voltages for every cell input combination. The analog simulator then inserts or injects a defect selected from the defects of interest into the circuit schematic by modifying the transistor-level netlist or component values. For example, if a fault is a bridge, then a small resistor is inserted between the corresponding nodes. For an open fault, the affected electrical components are disconnected (or a very high resistance is inserted).

A set of digital input patterns is simulated on the modified netlist, and the results are analyzed. If the analog simulator determines that a given defect is detectable, the simulator further determines the detection conditions for detecting that defect. That is, it notes those input patterns that elicit sufficiently severe improper circuit behavior, for concise test pattern generation. The analog simulator may therefore need to perform a very large number of analog simulations for every library cell to simulate a large number of defects.

In one exemplary processor design, early prior art methods generated 17,000 test patterns, and the cell-aware ATPG method generated an additional 7,000 test patterns. For a single library cell in this example, transistor-level analog simulations were run for each of forty-eight faults in the extracted fault list, for a total of forty-nine simulations per fault including the fault-free case. The fault count for an entire cell library, often having up to 1800 cells, is expected to scale accordingly, so characterizing a library may require nearly 100,000 individual analog fault simulations. While some fault simulations may require only DC solutions, others may require more time-consuming at-speed transient results.

Even with today's computer hardware and commercially available analog simulators, cell-aware ATPG simulations may require days of run time for a complete cell library characterization. This simulation bottleneck severity is likely to worsen as circuit density and complexity grows, causing more potential intra-cell fault locations in standard cell libraries. Accordingly, the inventors have developed a more efficient analog simulation solution to support cell-aware automated test pattern generation by using simulation techniques for fault sensitivity analysis.

DETAILED DESCRIPTION

This description presents a new system, method, and computer program product for cell-aware fault model generation. Embodiments determine defects of interest for a cell, typically from a cell layout and a transistor-level cell netlist. A circuit simulator performs analog fault simulation on the transistor-level netlist to determine detectable defects from the defects of interest, and detection conditions for the detectable defects. The circuit simulator may employ a Fault Sensitivity Analysis (FSA) approach, potentially in addition to conventional approaches, for greatly accelerated fault detection. Embodiments generate and output cell-aware fault models for the detectable defects from the detection conditions, for use in automated test pattern generation.

Currently available cell-aware ATPG flows require significant and potentially prohibitive analog simulation times. This limitation stems from the requirement to simulate each cell in a standard cell library in the presence of each of the many extracted potential faults via many separate simulation runs. Embodiments of the present invention address this analog simulation bottleneck, and enable an improved cell-aware flow by using the FSA algorithm.

Figure 1:
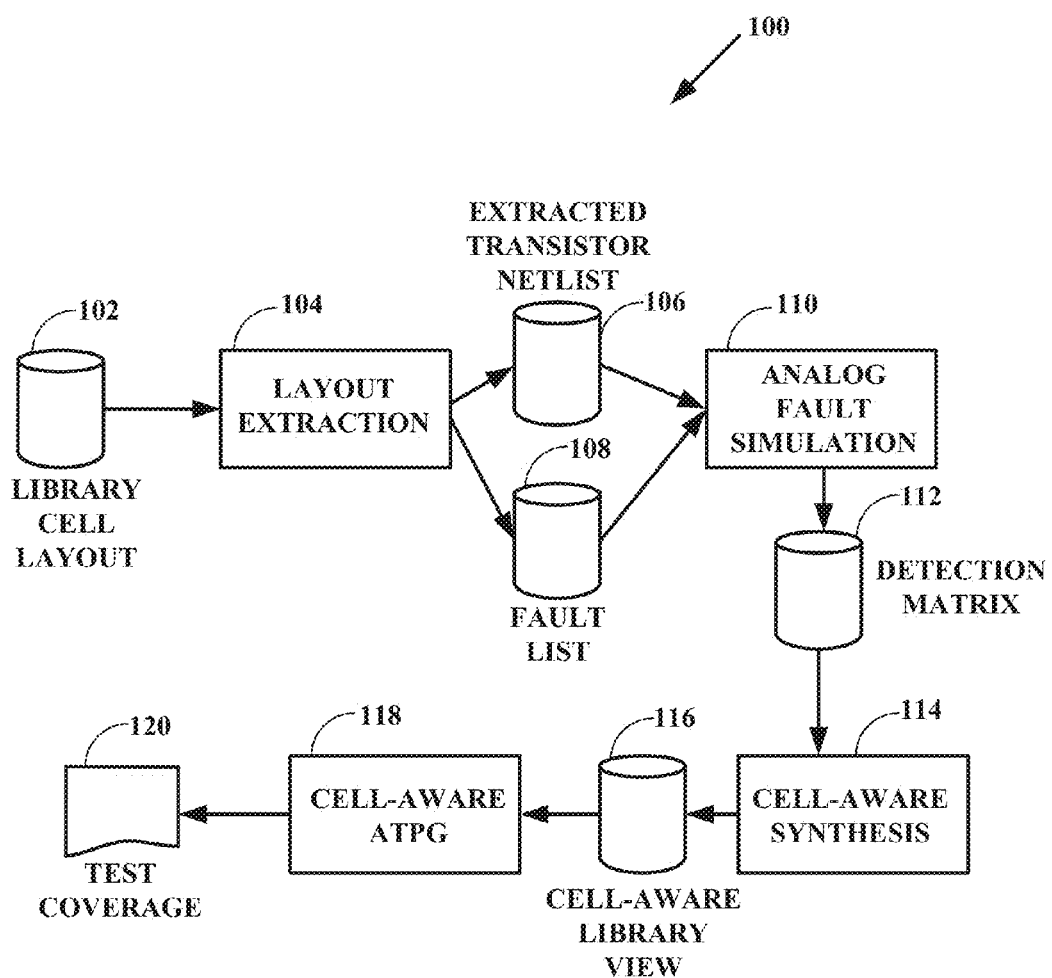
FIG. 1 is a diagram of a conventional cell-aware automated test pattern generation system.
Figure 2:
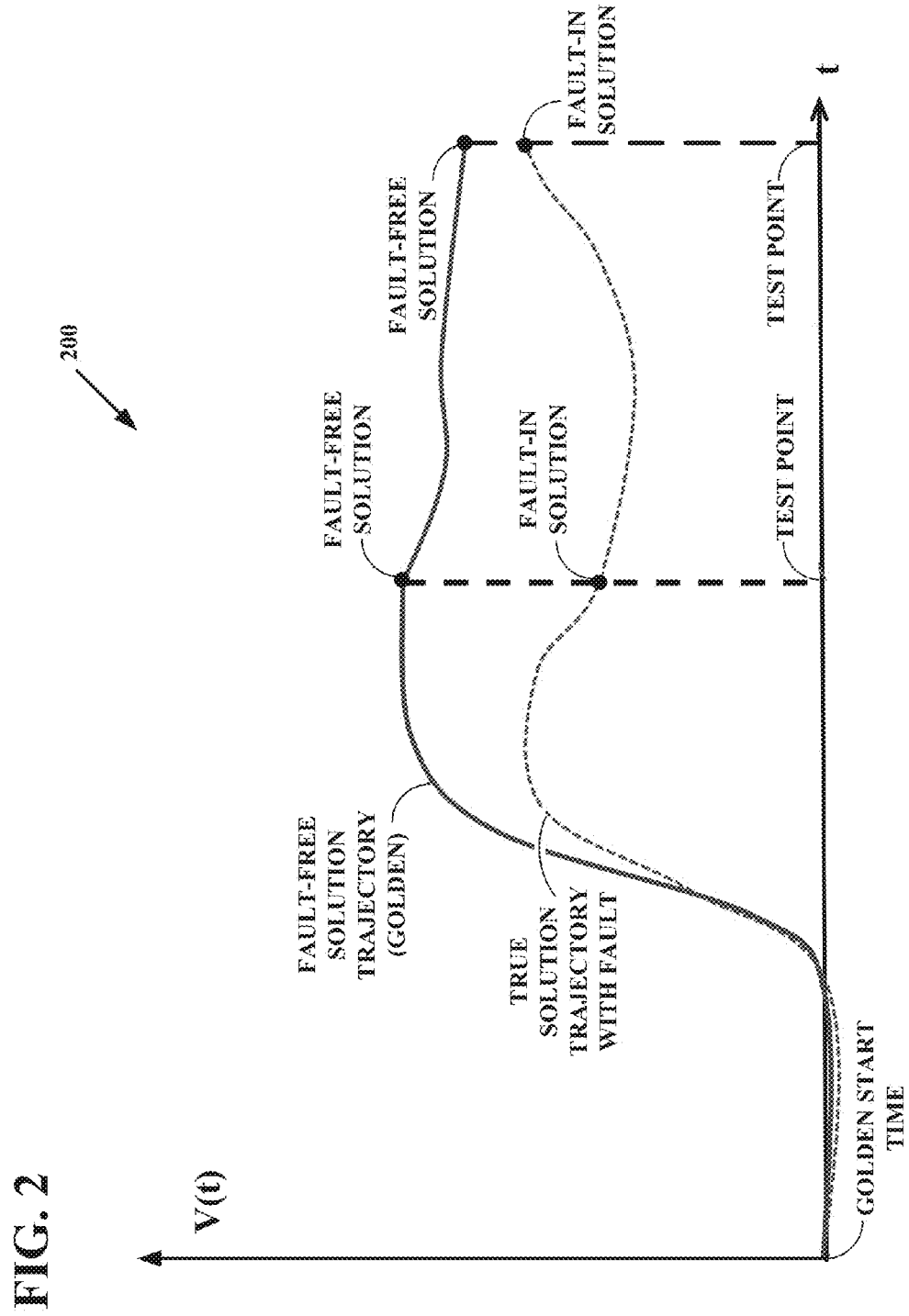
FIG. 2 is a diagram of a conventional fault simulation approach.

FIG. 2 shows a conventional non-FSA fault simulation approach. First, the fault-free or "golden" simulation is run from a start time through two exemplary test points. The test points may be related to input transitions of interest. The resulting fault-free output voltage solution trajectory is shown as the solid upper trace. Then, once the fault-free simulation run is complete, a fault is inserted into the circuit and a separate second simulation run is started on the modified circuit, typically beginning at the same start time and continuing through the two exemplary test points. The resulting fault-in solution trajectory is shown is the dashed lower trace. In this case, the fault causes a significant difference in the simulated voltage.

A conventional non-FSA fault simulation approach generally uses an analog simulator that has not been optimized to take advantage of stored results of a fault-free simulation, nor to insert one or more faults during a single simulation run. Therefore, for a large number of test points and a large number of faults, with fairly tight tolerances typical for analog simulations, the total simulation time can become burdensome. Further, it is possible that each fault may be modeled by a number of different inserted resistance values to determine a circuit's fault sensitivity, and a separate simulation run may be required for each value.

Figure 3:
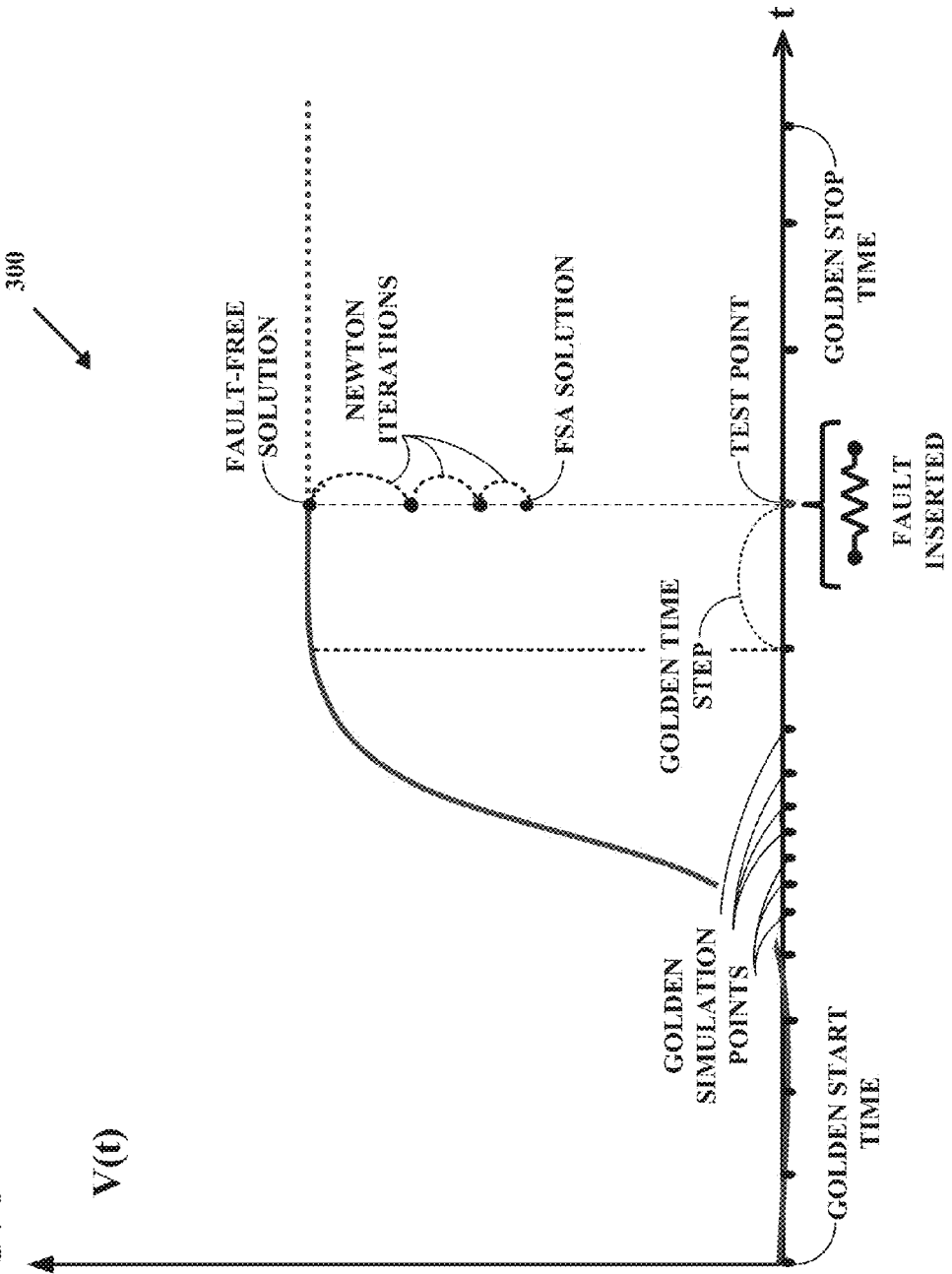
FIG. 3 is a diagram of a Fault Sensitivity Analysis simulation approach, according to an embodiment.

FIG. 3 shows a Fault Sensitivity Analysis simulation approach, according to an embodiment. In this example, the fault-free or "golden" analog simulation may begin at a start time and proceed through the simulated output voltage transition as shown, up to a specified stop time. A number of simulation points may be needed to resolve the voltage waveform accurately. Commercial analog simulation tools use a variety of methods to control their internal equation-solving iterations, but generally more internal time steps may be required when circuit voltages are changing significantly, while fewer internal time steps may be required when circuit voltages are not changing as much. The analog simulator with FSA capability may save the fault-free simulation results for subsequent re-use, typically at specified test points although the simulation results at various internal time points may also be saved.

Next, a fault may be inserted into the previously fault-free circuit, and the same analog simulation run may be continued to determine the fault-in or FSA simulation results. The simulator may "rewind" its internal time setting to resume simulation at the same start time as in the fault-free portion of the simulation run, or as shown here it may rewind its internal time setting to resume simulation at the test point shown. In this example, a fault may be inserted at that test point, which corresponds to a point in time where a fault-free solution was previously obtained. In some embodiments, FSA-capable simulators may re-use the fault-free voltage solution result from such a test point as an initial solution estimate for the fault-in simulation. The simulator may then undergo a number of Newton iterations as it converges toward the correct fault-in output voltage value, shown here as "FSA Solution".

The FSA-capable analog simulator may repeat this process for a number of test points for a particular fault during a single simulation run. Such a simulator may also repeat the process for a number of faults during the same simulation run. The FSA-capable simulator does not need to repeat the fault-free solution process, but may instead, in some embodiments, only insert faults at specific test points where simulation is required. The simulation algorithm described performs very well when the fault-in solution is close to the fault-free solution, which is generally the case where the fault is not causing severe circuit behavior changes that affect the simulated voltage of interest. However, there may be convergence issues in other conditions where the fault-in circuit behaves very differently compared to the fault-free circuit. Users may therefore, for some embodiments, specify the maximum number of Newton iterations that may be allowed at each test point. In other embodiments, the user may instruct the simulator to use the last fault-in test point solution as its initial solution estimate for the next fault-in test point solution, instead of using the saved fault-free solution data.

Figure 4:
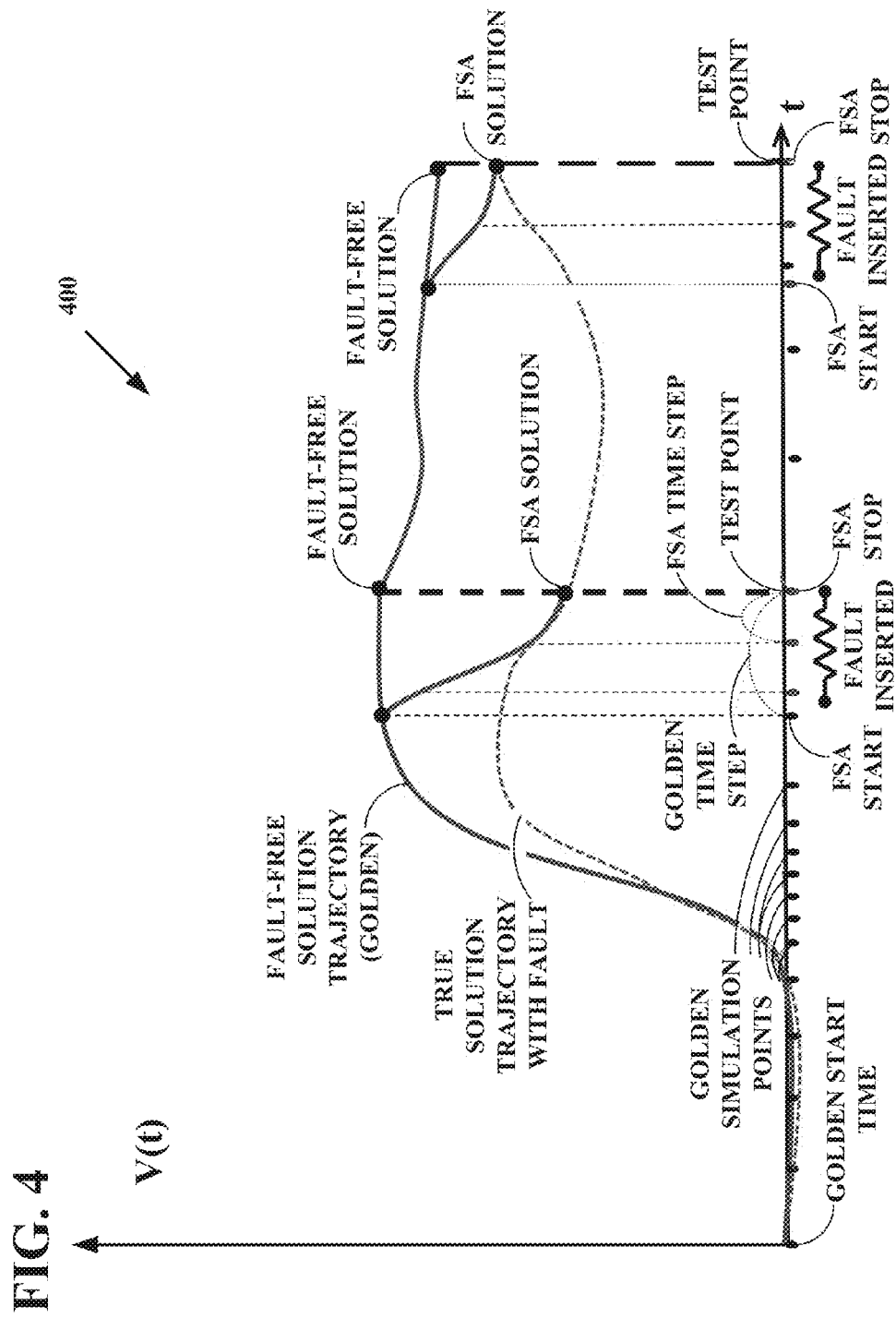
FIG. 4 is a diagram of a Fault Sensitivity Analysis simulation using a "refine" homotopy approach, according to an embodiment.

FIG. 4 shows a Fault Sensitivity Analysis simulation using a "refine" homotopy approach, according to an embodiment. In this embodiment, the fault is not inserted only at the various test points of interest, but instead is also inserted some duration prior to the test points of interest. This allows the FSA-capable analog simulator to perform calculations during a simulation interval rather than at a single test point, enhancing the likelihood of proper convergence. The simulation interval may be user-selectable, so a user may "refine" the interval for the best trade-off between simulation speed and reliable convergence. During the simulation interval, the simulated voltage of interest may iterate from an initial solution estimate at the time of fault insertion to a final solution at the test point. As with other embodiments, the initial solution estimate may be the fault-free solution at the fault insertion point, or it may be the fault-in solution at the previous test point.

Further, it may be advantageous for the analog FSA-capable simulator to repeat the process of fault insertion and simulation during a particular simulation interval for a number of faults. In this manner, after the simulation results are calculated for a number of faults at a particular test point, the simulator may then move to the next fault insertion point. For example, when simulating a bridging fault, if an initial bridging fault resistance value of a set of fault resistance values to be tested is large, the solution may be close to that of the fault-free simulation. As the next lower fault resistance value is inserted during processing of the same simulation interval, convergence may be more likely if the preceding fault-in solution voltage value is used for an initial solution estimate. The FSA-capable simulator embodiments may therefore perform simulations according to an order of nested operations that may be selected for optimal overall fault simulation performance.

In FIG. 4, the fault-free solution is shown again as the solid upper trace, extending from a start time through a number of simulation points and test points of interest. A fault-in solution trajectory is shown again as the lower dashed trace, but in contrast to non-FSA capable simulators, this full fault-in solution need not actually be simulated. Instead, the FSA-capable analog simulator may insert a fault at the first "FSA Start" point, and may set an initial solution estimate equal to the fault-free solution value at that point as shown. The fault may be inserted at one fault-free simulator time step before the first test point, or at some user-selectable or "refinable" time span before the first test point. As shown, the FSA-capable simulator may then proceed through a number of its own internal time steps while it adjusts its solution estimate (downward in this case) toward a final value marked "FSA Solution". In another embodiment, the FSA-capable simulator may gradually reduce the inserted fault resistance value on its own, between two specified fault resistance values to be tested, to enhance convergence.

Figure 5:
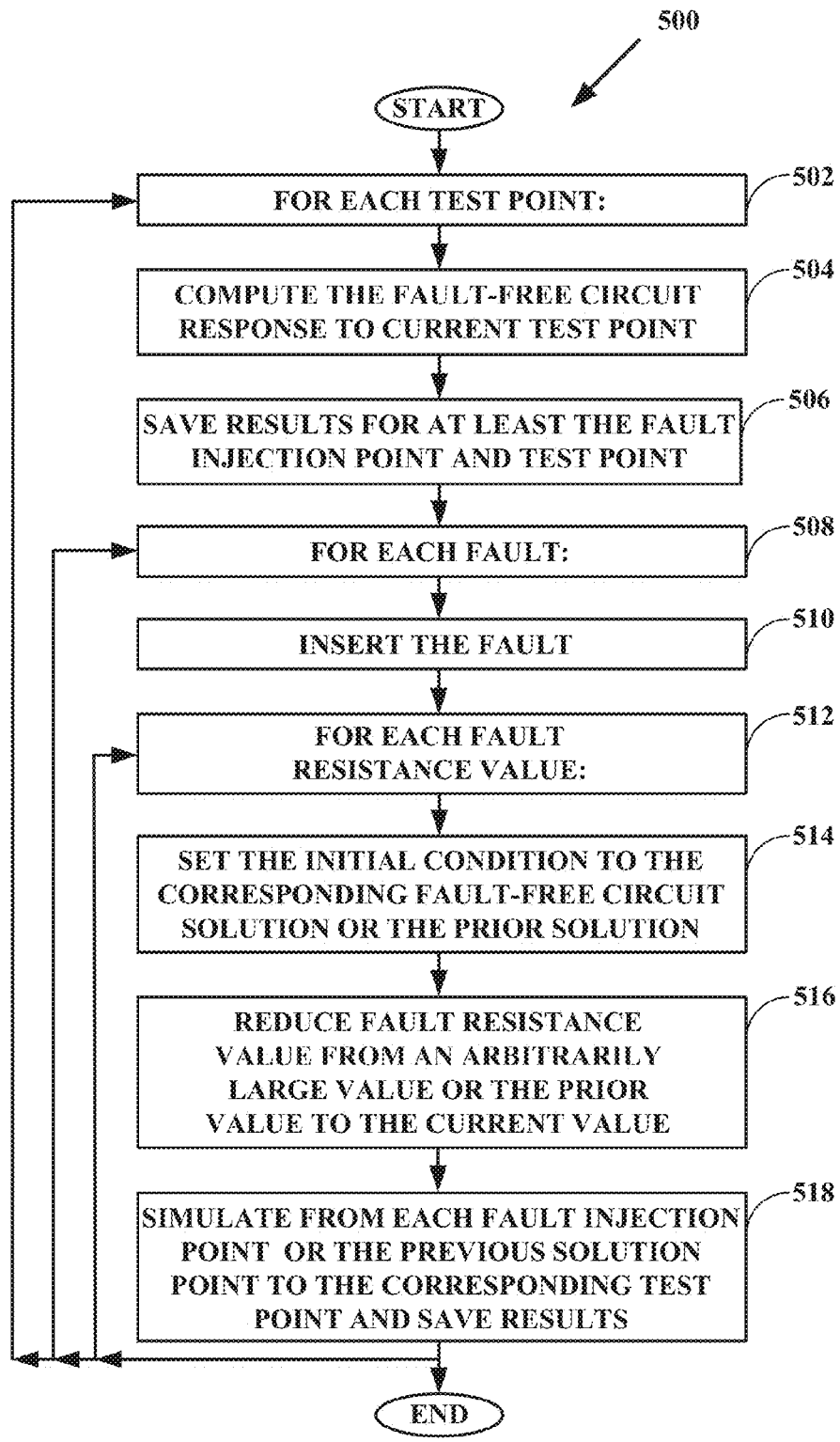
FIG. 5 is a diagram of a Fault Sensitivity Analysis simulation method, according to an embodiment.

FIG. 5 shows a diagram of an FSA simulation method, according to an embodiment. The method may start an outer loop at 502 over all test points to be evaluated. At 504, the simulator may compute the fault-free circuit response from an initial time up to the test point. For the first test point, the initial time may be an overall simulation start time, while for other test points the initial time may be the previous test point. At 506, the simulator may store the results for at least the current fault insertion point and current test point; the simulator may also store intermediate values if specified by a user.

The method may start another loop within the first loop at 508 over all faults to be evaluated for detectability. At 510, the simulator may insert the fault to be evaluated into the circuit design. At 512, the method may start a final inner loop over all fault resistance values to be evaluated. At 514 the simulator may set the initial condition for the fault insertion point for the test point being evaluated according to the corresponding fault-free circuit solution in the case of a first fault resistance value of this final inner loop, or to the prior simulation results in the case of a subsequent fault resistance value of this final inner loop. In the case of a first fault resistance value of this final inner loop, the simulator may rewind the time to the fault insertion point, while for subsequent fault resistance values of this final inner loop, the simulator may rewind the time to that of the prior simulation results. At 516, the simulator may set the fault resistance value by different methods. For the first fault resistance value of this final inner loop, the simulator may set an arbitrarily large resistor value (e.g., 1 GOhm) and then gradually decrease the resistor value to the desired fault resistance value. For subsequent fault resistance values of this final inner loop, the simulator may decrease the prior fault resistance value to the current fault resistance value being evaluated. At 518, the simulator may perform a transient analysis from a rewind point as described above to the corresponding test point, and may store the simulation results.

The method thus may iterate over all test points required, for all faults required, and for each fault resistance value required, in that order. The method may determine fault coverage, for example by comparing simulation results at each test point with detection threshold conditions. The method may compute fault coverage immediately following completion of the simulation run or by post-processing results.

Figure 6:
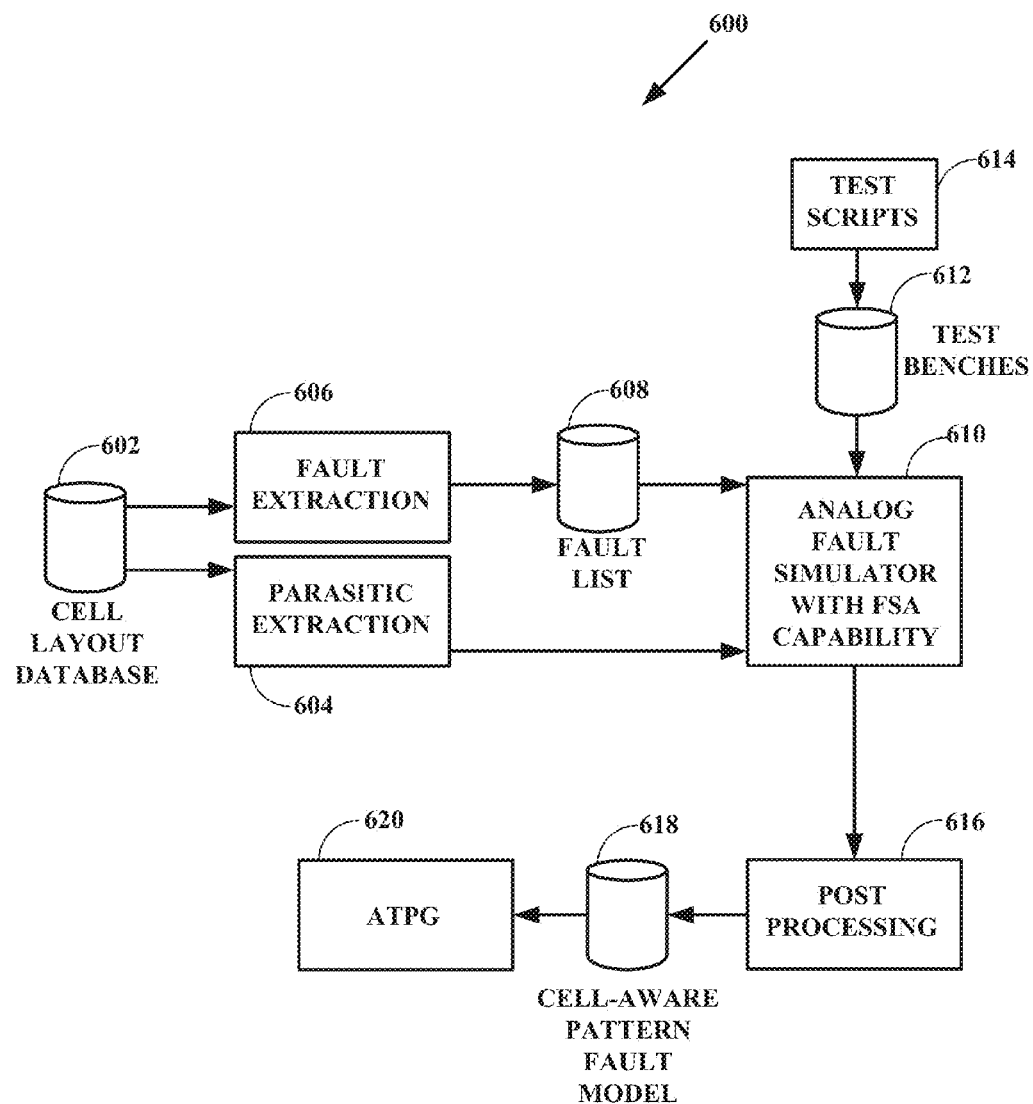
FIG. 6 is a diagram of a cell-aware ATPG flow using an analog simulator with Fault Sensitivity Analysis (FSA) capability, according to an embodiment.

FIG. 6 shows a cell-aware ATPG flow using an analog simulator with FSA capability, according to an embodiment. This flow may be optimized to greatly reduce the time spent in the detailed analog circuit simulations by taking full advantage of the FSA capability as described above recently introduced in a commercially available simulator. The flow may leverage other commercially available tools to perform a fault extraction and cell-aware ATPG synthesis, and to drive the analog simulation portion. The analog simulation portion itself may leverage the simulator's FSA capability where possible to more efficiently perform the analog simulations. Some sequential cells however may not be amenable to FSA and may require a conventional simulation approach, as will be described.

A layout database 602 may provide a cell layout to a parasitic extraction tool 604 and a fault extraction tool 606. The fault extraction tool 606 may generate a fault list 608 from the layout. Fault list 608 and extracted parasitic information may then be provided to analog simulator 610, which has FSA capability. Analog simulator 610 may be controlled by test scripts 614 and test benches 612, which may generate an FSA-compatible netlist including a fault table describing the faults to be processed during a single simulation run instead of during separate simulation runs as with a non-FSA simulator. Results from analog simulator 610 may be post-processed at 616, e.g., into a detection matrix, and the results passed to a cell-aware pattern fault model 618 for use by an ATPG system 620, which may be a conventional ATPG tool.

The overall flow is notable in that a detailed maximally-precise simulation need not be performed for each fault under consideration. The simulator needs to run the simulations only with sufficient accuracy to determine if faults are merely detectable, and does not need to resolve each transistor node voltage down to the millivolt level. Node level outputs for logic high/low states that do not meet a specified detection condition, such as falling within a predetermined large percentage (e.g., 20%) of the VDD or VSS analog voltage rail values, may be considered to be detectable, at least for the slow-speed patterns. FSA simulations may output fault tables that may be post-processed to generate outputs resembling those from a non-FSA simulator that are useful for creating a detection matrix.

Figure 7:
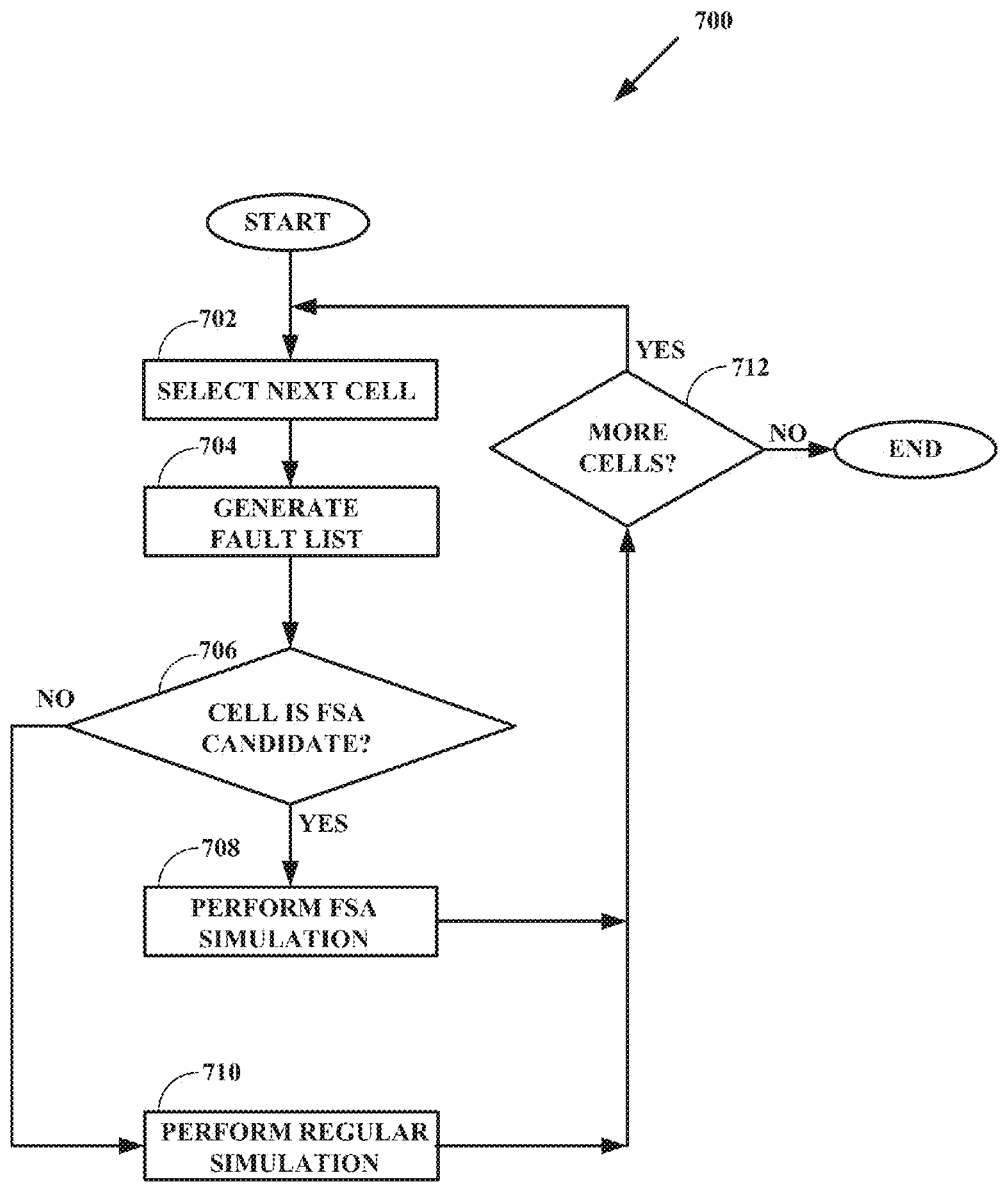
FIG. 7 is a diagram of a hybrid fault model generation flow that combines both FSA and conventional non-FSA approaches, depending on whether a specific cell is amenable to FSA, according to an embodiment.

FIG. 7 shows a hybrid fault model generation flow that combines both FSA and conventional non-FSA approaches, depending on whether a specific cell is amenable to FSA, according to an embodiment. Note that in the case of FSA, each of the faults may be applied within a single simulation run, with all cell faults applied at each simulation time-point of interest (typically corresponding to transitions in the input truth table waveforms). Each fault may be simulated accurately enough to determine if the fault is detectable. In contrast, the conventional brute force approach applies each fault first, and then for each fault runs a separate analysis to exercise the truth table.

At 702, the flow may select a cell from a library, and at 704 may generate a fault list. The fault list may be generated using conventional layout based fault generation tools, which may incorporate statistical defect models provided by integrated circuit manufacturers for example. At 706, the flow may determine if the selected cell is amenable to FSA-based simulation (some cells may not be, if they require sequential evaluation). If the selected cell is compatible with the FSA methodology, an analog circuit simulator may simulate the cell at

708. Otherwise, the analog circuit simulator may perform a conventional circuit simulation at 710. At 712, the flow determines if additional cells require processing, and if so the methodology described may repeat, otherwise the fault model generation flow may end. The generated models may then be processed by a conventional ATPG system.

Figure 8:
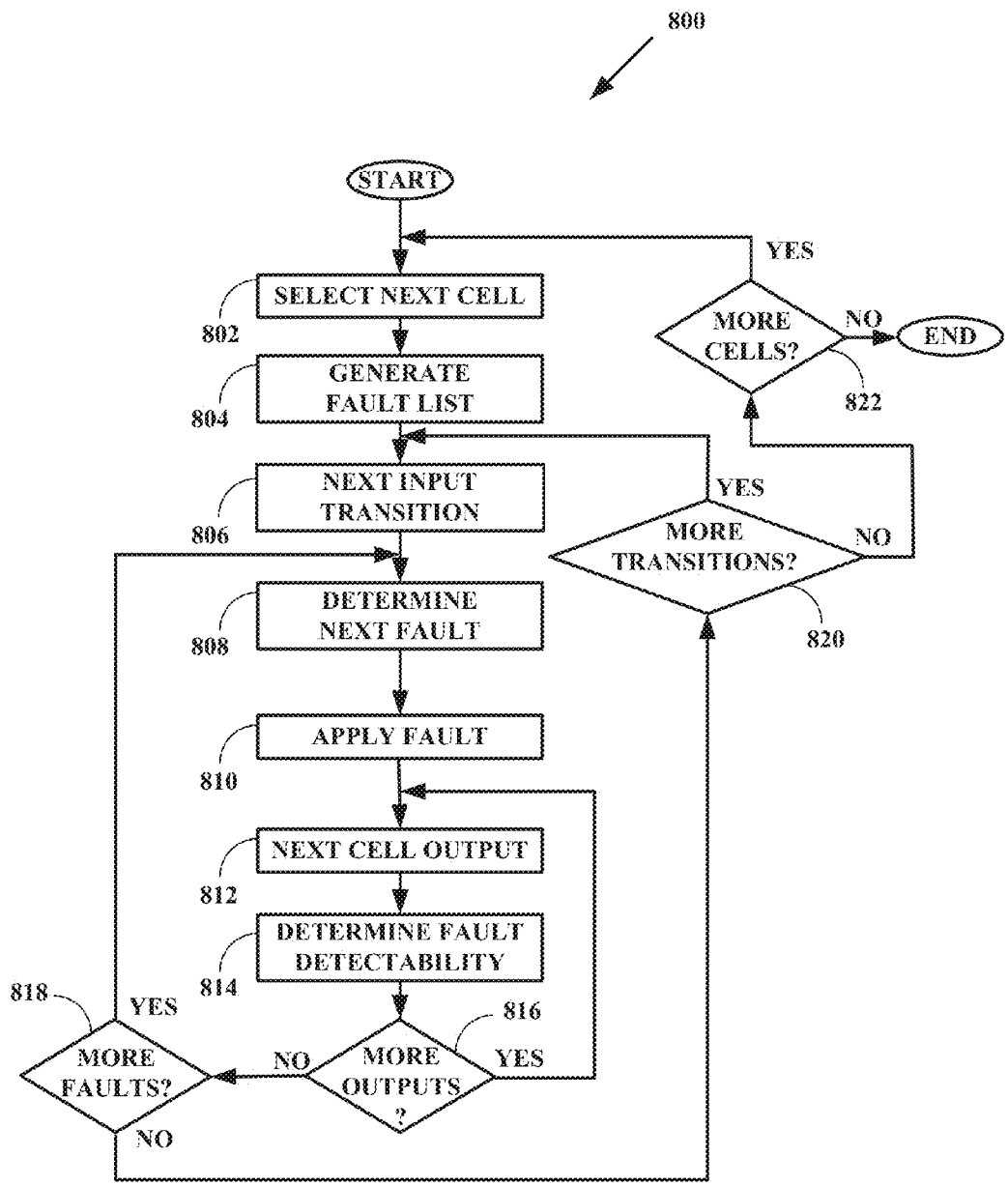
FIG. 8 is a diagram of a fault model generation flow, assuming all cells are amenable to the FSA approach, according to an embodiment.

FIG. 8 shows a fault model generation flow, assuming all cells are amenable to the FSA approach, according to an embodiment. At 802, the flow may select a cell from a library, and at 804 may generate a fault list as previously described. The selection of cells may form the outermost loop in the overall flow. At 806, the flow may then proceed with the next layer of simulation, which is to proceed through the various input transitions to be simulated. At 808, the flow may then proceed with next layer of simulation, which is to proceed through the various faults to be simulated. At 810, the fault may be applied and the simulator may begin the innermost layer of simulation, which is to proceed through the various cell outputs to be processed. At 812, the simulator may determine the next cell output, and at 814 may determine whether the simulated fault is detectable.

At 816, the flow may determine if there are further cell outputs to be processed; if so execution may return to 812 for the next cell output, otherwise execution may proceed to 818 where the flow may determine if there are more faults to be processed. If there are more faults to be processed, execution may return to 808 for the next fault, otherwise execution may proceed to 820 where the flow may determine if there are more transitions to process. If there are more transitions to be processed, execution may return to 806 to process the next input transition, otherwise execution may proceed to 822 where the flow may determine if there are more cells to be processed. If there are more cells to be processed, execution may return to 802 to select the next cell, otherwise the simulation is complete and the execution may end.

The analog Fault Sensitivity Analysis (FSA) in the embodiments described is thus a simulation technique used primarily for rapidly establishing the detection status of defects. FSA may enable very efficient analog defect simulation with reasonable accuracy for transient analysis in nonlinear circuits. The FSA technique may achieve much of its performance gain by simulating the presence of the analog faults only during short "refine" time intervals preceding the various simulation test/measurement points, which may represent different cell input transitions for example. For the remaining (longer) time intervals between the simulation test points, the fault-free simulation waveforms and circuit may be used (or re-used). Any nested order of faults and simulation test points may be simulated using the FSA algorithm, for any selected cell input transitions and for any number of selected cells, not only those detailed above.

In an additional embodiment, the FSA algorithm may also use a "stepping" approach as described above, wherein at the fault insertion time, the simulator is allowed to first determine the fault-free solution, and then each fault is suddenly (or gradually) introduced as additional Newton iterations are performed by the simulator's non-linear differential equation solver to determine the fault-in-place solution. Where it converges, which may depend on how gradually a fault is introduced in terms of internal equation solver iterations, the "stepping" approach may be even more efficient than the "refine" approach.

A proof-of-concept experiment was performed to:
1) Determine the viability of the FSA-based flow, i.e., can FSA correctly identify the detection status of a sufficiently large majority (80% or more) of the faults?

2) Determine simulation performance improvement potential, i.e., how much faster can FSA achieve these coverage results when compared with the prior art brute-force or non-FSA simulations?

For this experiment, a small but representative set of cells was selected from a 20 nm generic standard cell library. The selected cells included full adders, half adders, multiplexers, simple logic gates (NAND, NOR, with varying numbers of inputs), and combination logic gates in addition to various buffers, clock buffers and inverters. These cells were mostly selected for single drive strength only to keep simulations short for the purposes of the proof-of-concept evaluation. Scripts were written to netlist and stimulate each cell with piece-wise linear (PWL) analog waveforms corresponding to the cell's full input truth table, with output waveforms being sampled in response to each input transition after a suitable delay. Outputs were then compared to the expected values using truth tables.

For initial benchmarking, a representative subset of a standard cell library was characterized over a representative set of faults at the transistor level. The FSA simulation times were compared to a baseline set of simulations using a standard non-FSA simulation approach. In an alternative embodiment, a hybrid flow combines the FSA simulation flow with a standard simulation sub-flow.

A nominal fault-free simulation was first performed, to verify that the cells were behaving as expected, i.e., the given truth table outputs were correctly obtained for each of the inputs. A fault-generator script was used to mimic the fault-extraction step without the need for detailed cell layouts. For the fault generator, each transistor device in a pre-layout cell schematic was considered, and a one-ohm bridge fault was generated across each unique pair of that transistor's terminals. Terminal pairs that were shorted by design in the schematic were ignored in this process. A dictionary of 554 unique faults was generated for the small sample library.

Next, a baseline set of brute-force or non-FSA simulations was performed, where for each cell a separate netlist was constructed for each of the generated faults (i.e., each netlist contained one additional bridge resistor in addition to the cell and its stimulus). Each such netlist was then simulated and its waveforms post-processed to determine each fault's detectability. Per-cell simulation times were accumulated. Waveform post processing times were not included. The fault detection criterion for each netlist was whether in response to any input (truth table) transition, any cell output deviated from its ideal output logic high or low values (taken to be VDD, VSS respectively) by more than some significant percentage (in this case a default value 20%) of the rail-to-rail swing; if so, then the fault was considered detectable.

The baseline simulations determined that of the 554 generated faults, 363 of these were detectable via the brute force analog simulation approach. The average accumulated baseline simulation time for this standard cell library representative subset was 660 seconds.

Finally, a set of FSA-based simulations was performed according to FIG. 8. All cells were considered amenable to FSA. Here, FSA was applied and the resulting output signal values were processed using the same fault detectability criterion. The FSA "stepping" homotopy method was used in the simulator, with the maxsteps parameter set to four. In this case, the overall loop of operations was as follows, with all faults for a cell being evaluated at each truth table input transition:

For each cell in standard cell library:
    Extract/Generate fault list for cell Run simulation: Foreach transition timepoint in cell's truth table input combinations:
   Foreach fault within the cell:
      Apply each fault using 'stepping' homotopy method
      For each cell output:
         Determine if output is correct/incorrect (fault detectable)
For any cell/fault combination for which at least once cell output was incorrect according to the truth table equations, the fault was considered detectable.

The FSA analysis completed in approximately 37 seconds, on average. Compared to the baseline analysis, this shows a simulation performance improvement of (660/37), i.e., 18×. The results show that of the 554 generated faults, 325 were detectable using FSA using the same detectability criterion as for the brute force analysis. Only 39 of the 363 detectable faults were not identified by FSA. No false-positives were produced, i.e., there were no FSA-predicted detections that were found to not be detections by the brute force analysis. The 325 correctly detected faults represent a fraction of 325/363, i.e., 90% of the brute-force-analysis-identified faults.

To summarize, FSA correctly detected 90% of the faults with an 18X simulation performance gain. These results meet or exceed the coverage requirements to enable the cell-aware test pattern synthesis. This combination of increased simulation throughput with cell-aware ATPG will substantially improve overall integrated circuit coverage while greatly reducing analog simulation time and cost.

Figure 9:
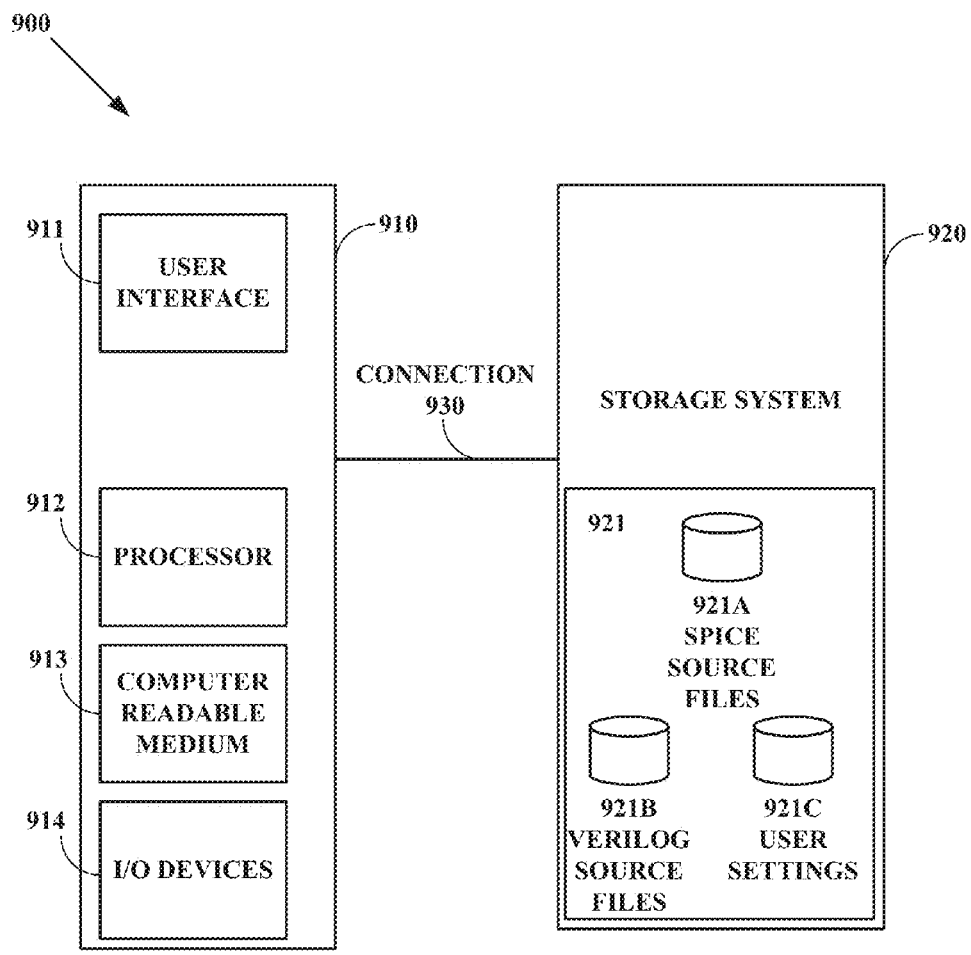
FIG. 9 is a block diagram of a circuit analysis system, according to an embodiment.

FIG. 9 shows a block diagram of an exemplary circuit analysis system 900, according to an embodiment. This system may provide simulator functionality for any of the methods described above. A user may access the system 900 through a standalone client system, client-server environment, or a network environment. System 900 may comprise one or more clients or servers 910, one or more storage systems 920, and a connection or connections 930 between and among these elements.

Client 910 may execute instructions stored on transitory or non-transitory computer readable medium 913 with processor 912, and may provide a user interface 911 to allow a user to access storage system 920. The instructions may be part of a software program or executable file that may operate electronic design automation (EDA) software. Client 910 may be any computing system, such as a personal computer, workstation, mobile computer, or other device employing a processor which is able to execute programming instructions. User interface 911 may be a GUI run in a user-controlled application window on a display. A user may interact with user interface 911 through one or more input/output (I/O) devices 914 such as a keyboard, a mouse, or a touch screen.

Storage system 920 may take any number of forms, including but not limited to a server with one or more storage devices attached to it, a storage area network, or one or a plurality of non-transitory computer readable media. Databases 921 may be stored in storage system 920 such that they may be persistent, retrieved, or edited by the user. Databases 921 may include SPICE source files 921A, Verilog source files 921B, and a user input database 921C for example. These databases may be kept as separate files or systems, or may be merged together in any appropriate combination.

Only one client 910 is shown connected to storage system 920 through connection 930, which may be a simple direct wired or wireless connection, a system bus, a network connection, or the like, to provide client 910 with access to storage system 920. In another aspect, connection 930 may enable multiple clients 910 to connect to storage system 920. The connection may be part of a local area network, a wide area network, or another type of network, again providing one or more clients with access to storage system 920. Depending on system administrator settings, client 910's access to system storage 920 or to other clients may be limited.

Figure 10:
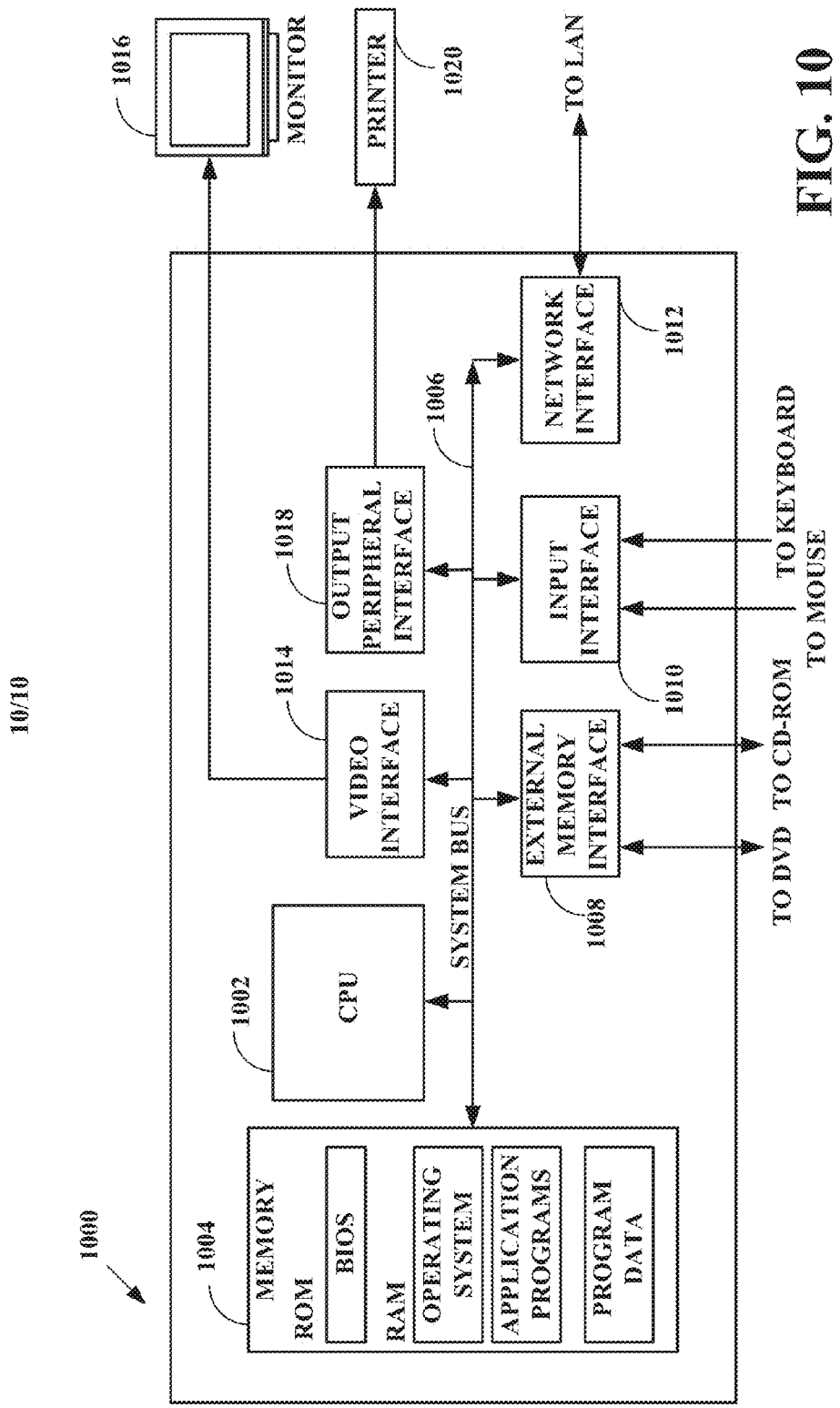
FIG. 10 is a diagram of a computer system, according to an embodiment.

FIG. 10 depicts a computer system comprising the structure for implementation of the embodiments described above. Computer system 1000 comprises a central processing unit (CPU) 1002 that processes data stored in memory 1004 exchanged via system bus 1006. Memory 1004 typically includes read-only memory, such as a built-in operating system, and random-access memory, which may include an operating system, application programs, and program data. Computer system 1000 also comprises an external memory interface 1008 to exchange data with a DVD or CD-ROM for example. Further, input interface 1010 may serve to receive input from user input devices including but not limited to a keyboard and a mouse. Network interface 1012 may allow external data exchange with a local area network (LAN) or other network, including the internet. Computer system 1000 also typically comprises a video interface 1014 for displaying information to a user via a monitor 1016. An output peripheral interface 1018 may output computational results and other information to output devices including but not limited to a printer 1020.

Computer system 1000 may comprise for example a personal computer or an engineering workstation, each of which is widely known in the art and is commonly used for integrated circuit design tasks, along with software products commercially available for performing computer-aided integrated circuit design tasks. Computer system 1000 may also comprise a mobile computer, including for example a tablet computer or a smart phone. The computer system of FIG. 10 may for example receive program instructions, whether from existing software products or from embodiments of the present invention, via a computer program product and/or a network link to an external site.

For purposes of explanation, specific nomenclature is set forth to provide a thorough understanding of the present invention. Description of specific applications and methods are provided only as examples. Various modifications to the embodiments will be readily apparent to those skilled in the art and the general principles defined herein may be applied to other embodiments and applications without departing from the spirit and scope of the invention. Thus the present invention is not intended to be limited to the embodiments shown, but is to be accorded the widest scope consistent with the principles and steps disclosed herein.

As used herein, the terms "a" or "an" shall mean one or more than one. The term "plurality" shall mean two or more than two. The term "another" is defined as a second or more. The terms "including" and/or "having" are open ended (e.g., comprising). Reference throughout this document to "one embodiment", "certain embodiments", "an embodiment" or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation. The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

In accordance with the practices of persons skilled in the art of computer programming, embodiments are described with reference to operations that may be performed by a computer system or a like electronic system. Such operations are sometimes referred to as being computer-executed. It will be appreciated that operations that are symbolically represented include the manipulation by a processor, such as a central processing unit, of electrical signals representing data bits and the maintenance of data bits at memory locations, such as in system memory, as well as other processing of signals. The memory locations where data bits are maintained are physical locations that have particular electrical, magnetic, optical, or organic properties corresponding to the data bits.

When implemented in software, the elements of the embodiments may serve as the code segments directing a computing device to perform the necessary tasks. The non-transitory code segments may be stored in a processor readable medium or computer readable medium, which may include any medium that may store or transfer information. Examples of such media include an electronic circuit, a semiconductor memory device, a read-only memory (ROM), a flash memory or other non-volatile memory, a floppy diskette, a CD-ROM, an optical disk, a hard disk, a fiber optic medium, etc. User input may include any combination of a keyboard, mouse, touch screen, voice command input, etc. User input may similarly be used to direct a browser application executing on a user's computing device to one or more network resources, such as web pages, from which computing resources may be accessed.

While particular embodiments of the present invention have been described, it is to be understood that various different modifications within the scope and spirit of the invention will be apparent to ordinarily skilled artisans. The invention is limited only by the scope of the appended claims.

What is claimed is:

1. A method for cell-aware fault model generation comprising:
    determining defects of interest for a cell;
    using a computer, performing analog fault simulation on a transistor-level cell netlist to identify detectable defects from the defects of interest and specified detection conditions, including simulating at least some of the defects of interest using fault sensitivity analysis (FSA);
    generating cell-aware fault models for the detectable defects from the detection conditions; and
    outputting the cell-aware fault models.

2. The method of claim 1, wherein the performing analog fault simulation comprises using FSA if the cell is amenable to FSA, and otherwise comprises using a non-FSA simulation.

3. The method of claim 1, wherein the performing analog fault simulation using FSA comprises:
    in a single simulation run:
    for each simulation test point, simulating a fault-free circuit design and storing the fault-free circuit design simulation results; and
    for each combination of a simulation test point and a defect selected in a nested order, inserting a selected defect at a selected test point, simulating the circuit design, and storing the simulation results.

4. The method of claim 1, wherein the performing analog fault simulation using FSA comprises generating an FSA-compatible netlist including a fault table.

5. The method of claim 1, wherein the detectable defects are defects that, after being individually inserted into the transistor-level cell netlist, cause the cell to produce an output value satisfying at least one detection condition on a cell output port for a cell input combination.

6. The method of claim 1, wherein identifying detectable defects from the defects of interest and specified detection conditions comprises:
    comparing fault-free and fault-in-place simulation results to at least one detection condition; and
    if the at least one detection condition is met, storing the defect as detectable; and
    if the defect is detectable, determining detection conditions for the defect.

7. The method of claim 1, further comprising:
    processing fault output tables from the FSA simulations;
    determining detection conditions for all of the detectable defects;
    generating a detection matrix from the detection conditions for all of the detectable defects; and
    storing the detection matrix.

8. A non-transitory computer readable medium storing instructions that, when executed by a processor, perform a method for cell-aware fault model generation, the method comprising:
    determining defects of interest for a cell;
    performing analog fault simulation on a transistor-level cell netlist to identify detectable defects from the defects of interest and specified detection conditions, including simulating at least some of the defects of interest using fault sensitivity analysis (FSA);
    generating cell-aware fault models for the detectable defects from the detection conditions; and
    outputting the cell-aware fault models.

9. The medium of claim 8, wherein the performing analog fault simulation comprises using FSA if the cell is amenable to FSA, and otherwise comprises using a non-FSA simulation.

10. The medium of claim 8, wherein the performing analog fault simulation using FSA comprises:
    in a single simulation run:
    for each simulation test point, simulating a fault-free circuit design and storing the fault-free circuit design simulation results; and
    for each combination of a simulation test point and a defect selected in a nested order, inserting a selected defect at a selected test point, simulating the circuit design, and storing the simulation results.

11. The medium of claim 8, wherein the performing analog fault simulation using FSA comprises generating an FSA-compatible netlist including a fault table.

12. The medium of claim 8, wherein the detectable defects are defects that, after being individually inserted into the transistor-level cell netlist, cause the cell to produce an output value satisfying at least one detection condition on a cell output port for a cell input combination.

13. The medium of claim 8, wherein identifying detectable defects from the defects of interest and specified detection conditions comprises:
    comparing fault-free and fault-in-place simulation results to at least one detection condition; and
    if the at least one detection condition is met, storing the defect as detectable; and
    if the defect is detectable, determining detection conditions for the defect.

14. The medium of claim 8, further comprising:
    processing fault output tables from the FSA simulations;
    determining detection conditions for all of the detectable defects;

generating a detection matrix from the detection conditions for all of the detectable defects; and storing the detection matrix.

15. A system comprising:

a non-transitory memory storing executable instructions; and a processor executing the instructions to perform a method for cell-aware fault model generation, the method comprising:

determining defects of interest for a cell;

performing analog fault simulation on a transistor-level cell netlist to identify detectable defects from the defects of interest and specified detection conditions, including simulating at least some of the defects of interest using fault sensitivity analysis (FSA);

generating cell-aware fault models for the detectable defects from the detection conditions; and outputting the cell-aware fault models.

16. The system of claim 15, wherein the performing analog fault simulation comprises using FSA if the cell is amenable to FSA, and otherwise comprises using a non-FSA simulation.

17. The system of claim 15, wherein the performing analog fault simulation using FSA comprises:

in a single simulation run:

for each simulation test point, simulating a fault-free circuit design and storing the fault-free circuit design simulation results; and for each combination of a simulation test point and a defect selected in a nested order, inserting a selected defect at a selected test point, simulating the circuit design, and storing the simulation results.

18. The system of claim 15, wherein the performing analog fault simulation using FSA comprises generating an FSA-compatible netlist including a fault table.

19. The system of claim 15, wherein the detectable defects are defects that, after being individually inserted into the transistor-level cell netlist, cause the cell to produce an output value satisfying at least one detection condition on a cell output port for a cell input combination.

20. The system of claim 15, further comprising:

processing fault output tables from the FSA simulations;

determining detection conditions for all of the detectable defects;

generating a detection matrix from the detection conditions for all of the detectable defects; and storing the detection matrix.

* * * * *